United States Patent
Liu et al.

(10) Patent No.: US 6,340,887 B1
(45) Date of Patent: Jan. 22, 2002

(54) MULTIPLE CONTRAST FSE APPROACH TO BLACK BLOOD ANGIOGRAPHY WITH REDUNDANT AND SUPPLEMENTARY VASCULAR INFORMATION

(75) Inventors: Kecheng Liu; Jian Lin, both of Solon; Paul M. Margosian, Lakewood, all of OH (US)

(73) Assignee: Picker International Inc., Highland Heights, OH (US)

(*) Notice: Subject to any disclaimer, the term of this patent is extended or adjusted under 35 U.S.C. 154(b) by 0 days.

(21) Appl. No.: 09/400,228

(22) Filed: Sep. 21, 1999

(51) Int. Cl.$^7$ ................................................. G01V 3/00
(52) U.S. Cl. ..................................... 324/309; 324/306
(58) Field of Search .................................. 324/309, 306

(56) References Cited

U.S. PATENT DOCUMENTS

| | | | |
|---|---|---|---|
| 4,881,033 A | 11/1989 | Denison et al. | 324/309 |
| 5,229,717 A | 7/1993 | Hinks | 324/309 |
| 5,271,399 A | 12/1993 | Listerud et al. | 324/309 |
| 5,273,040 A | 12/1993 | Apicella et al. | 128/653.2 |
| 5,422,576 A * | 6/1995 | Kao | 324/309 |
| 5,431,163 A | 7/1995 | Kajiyama | 128/653.2 |
| 5,447,155 A | 9/1995 | NessAiver et al. | 128/653.2 |
| 5,528,144 A | 6/1996 | Gullapalli et al. | 324/309 |
| 5,557,204 A | 9/1996 | Lenz | 324/309 |
| 5,594,336 A | 1/1997 | Gullapalli et al. | 324/309 |
| 5,652,513 A | 7/1997 | Liu et al. | 324/306 |
| 5,672,970 A | 9/1997 | Takai | 324/309 |
| 5,786,693 A | 7/1998 | Gullapalli et al. | 324/309 |
| 5,825,185 A | 10/1998 | Liu et al. | 324/309 |

OTHER PUBLICATIONS

Alexander, et al. "Partial Fourier Acquisition and Improved Interpolation of 3DFSE Black–Blood Images for Cerebral MRA" Proceedings of ISMRM 6th Annual Meeting, Sydney, 1998, p. 795.

Liu, et al. "Sliding Interleaved Ky (SLINKY) Acquisition: A Novel 3D TOF Technique with Suppressed Slab Boundary Artifact" JMRI vol. 8:905–911, 1998.

Liu, et al. "Artifact Transformation Technique: Shifted Interleaved Multi–Volume Acquisition (SIMVA) for 3D FSE" Proceedings of ISMRM 6th Annual Meeting, Sydney, 1998, p. 572.

Oshio, et al. "T2–Weighted Thin–Section Imaging with the Multislab Three–Dimensional RARE Technique" J. Mag. Reson. Imag. 1991; 1:695–700.

"Two–Contrast RARE: A Fast Spin–Density and T2–Weighted Imaging Method", Higuchi, et al., JMRI vol. 1, No. 2, p. 147.

"Rapid Spin Echo Imaging (RARE) Producing Two Effective Echo Times By Sharing Views", Fram, et al., p. 218.

"Comparing the FAISE Method With Conventional Dual–Echo Sequences", Melki, et al., JMRI 1991, 1:319–326.

* cited by examiner

Primary Examiner—Jay Patidar
Assistant Examiner—Brij B. Shrivastav

(57) ABSTRACT

A black blood magnetic resonance angiogram is produced by exciting dipoles (52) and repeatedly inverting the resonance ($54_1$, $54_2$, . . . ) to produce a series of magnetic resonance echoes ($56_1$, $56_2$, . . . ). Early echoes (e.g., ($56_1$, . . . , $56_8$)) are more heavily proton density weighted than later echoes (e.g., ($56_9$, . . . , $56_{16}$)) which are more heavily T2 weighted. The magnetic resonance echoes are received and demodulated (38) into a series of data lines. The data lines are sorted (60) between the more heavily proton density weighted data lines and T2 weighted data lines which are reconstructed into a proton density weighted image representation and a T2 weighted image representation. The proton density weighted and T2 weighted image representations are combined (90) to emphasize the black blood from the T2 weighted images and the static tissue from the proton density weighted image. The combined image is a black blood magnetic resonance angiogram. The production of the angiogram is time efficient and displays enhanced vessel depiction.

10 Claims, 3 Drawing Sheets

MULTIPLE CONTRAST FSE APPROACH TO BLACK BLOOD ANGIOGRAPHY WITH REDUNDANT AND SUPPLEMENTARY VASCULAR INFORMATION

BACKGROUND OF THE INVENTION

The present invention relates to the magnetic resonance imaging arts. It finds particular application in conjunction with black blood magnetic resonance angiography and may be described with particular reference thereto. It is to be appreciated, however, that the invention will also find application in conjunction with other types of angiography and other types of magnetic resonance imaging.

Measurement of blood flow, in vivo, is important for the functional assessment of the circulatory system. Angiography has become a standard technique for making such functional assessments. Magnetic resonance angiography (MRA) provides detailed angiographic images of the body in a non-invasive manner, without the use of contrast agents or dyes.

Traditionally, MRA methods can be divided into "white blood" and "black blood" techniques. In white blood angiographs or time of flight (TOF) angiographs, magnetic resonance signal from flowing blood is optimized, while signal from stationary blood or tissue is suppressed. This method has been problematic for a number of reasons. First, it is difficult to generate accurate images of the vascular system because the excited blood is constantly moving out of the imaging region. Also, blood vessels often appear more narrow because signal from the slow-flowing blood at the edges of the vessels is difficult to detect.

In contrast, black blood angiography methods utilize a flow-related signal void. The magnetic resonance signals from flowing blood are suppressed, while the signals stationary blood and tissue are optimized. In other words, flowing blood is made to appear dark or black on the magnetic resonance image due to an absence or minimum of resonance signal emanating from the blood. The black blood method is typically preferable to the white blood method because it is easier to make flowing blood appear dark for the aforementioned reasons. In addition, blood vessels on a black blood angiograph appear larger because the slow-moving blood at the edges is clearly imaged. Also, the black blood MRA provides more detailed depiction of small vessels where blood flow is slower.

In black blood MRA, flow-related signal void can be generated by using spoiling gradients, pre-saturation RF pulses, or defocused flowing spins. The first two means are mostly used in field echo (FE) style sequences while the latter one is typically used in spin echo (SE) style sequences, such as fast spin echo (FSE) sequences.

In the past, proton density weighted (PDW) FSE sequences have been used to acquire images. For a sixteen echo FSE sequence, the first echo is oriented near the center of k-space, the second echo is located in the adjacent segment, and so on. In such an arrangement of k-space data, PDW images are acquired. These images result in good background for images. However, slow-flowing dipoles are refocused by the subsequent 180° pulses contributing signal and resulting in "filling", i.e., black blood in the center of arteries and veins and white or gray blood along the blood vessel walls, in capillaries, and in areas with slower moving blood. The filling effect leads to falsified vessel definition. While this problem may be resolved by using pre-saturation RF pulses, this comes at the cost of increasing SAR which is very critical on a high field system ($\geq 1.5$ T).

The present invention contemplates a new method and apparatus which overcomes the above-referenced problems and others.

SUMMARY OF THE INVENTION

In accordance with one aspect of the present invention, a method of generating a black blood magnetic resonance angiograph is provided. Dipoles within a selected imaging region are excited to produce magnetic resonance signals. A train of magnetic resonance echoes is induced after the excitation. Early echoes are more heavily proton density weighted and later echoes are more heavily T2 weighted. The train of magnetic resonance echoes is phase and frequency encoded. The echoes are received and demodulated into a series of data lines. The data lines are sorted between data lines from more heavily proton density weighted echoes and data lines from more heavily T2 weighted echoes. The more heavily proton density weighted data lines are reconstructed into a proton density weighted image representation; and the more heavily T2 weighted data lines are reconstructed into a T2 weighted image representation. The proton density weighted and T2 weighted image representations are combined to generate a black blood angiographic image representation.

In accordance with another aspect of the present invention, a magnetic resonance imaging system includes a magnet for generating a temporally constant magnetic field through an examination region. A radio frequency transmitter excites and inverts magnetic dipoles in the examination region. Gradient magnetic field coils and a gradient magnetic field controller generate at least phase and read magnetic field gradient pulses across the examination region. A receiver receives and demodulates the magnetic resonance echoes to produce a series of data lines. A sorter sorts the data lines between proton density weighted data lines and T2 data lines. An early echo volume memory stores the proton density weighted data lines and a late echo volume memory stores the T2 weighted data lines. An image processor reconstructs the proton density weighted image lines into a proton density weighted image representation and the T2 weighted data lines into a T2 weighted image representation. A combination processor combines the proton density weighted and the T2 weighted image representations.

One advantage of the present invention is that it is more scan time efficient.

Another advantage of the present invention is that a proton density weighted image, a T2 weighted image, and a black blood angiogram are acquired from a single scan.

Another advantage of the present invention is that it leads to more accurate vascular morphology.

Another advantage of the present invention is that it eliminates mis-registration error between proton density weighted images and T2 weighted images.

Yet another advantage of the present invention is that it reduces the SAR level.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1A:
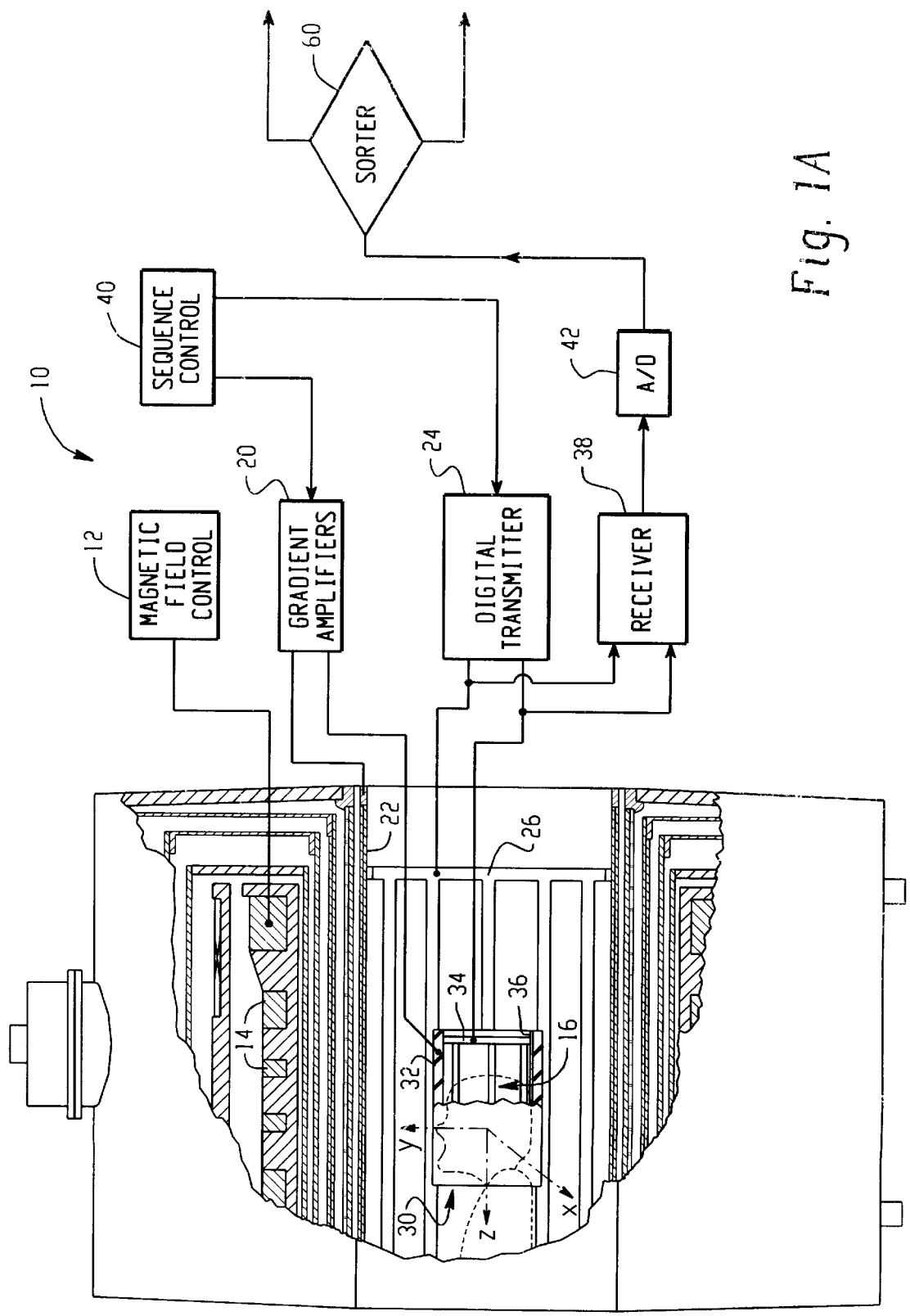
FIGS. 1A and 1B taken together are a diagrammatic illustration of a magnetic resonance imaging system in accordance with the present invention.
Figure 1B:
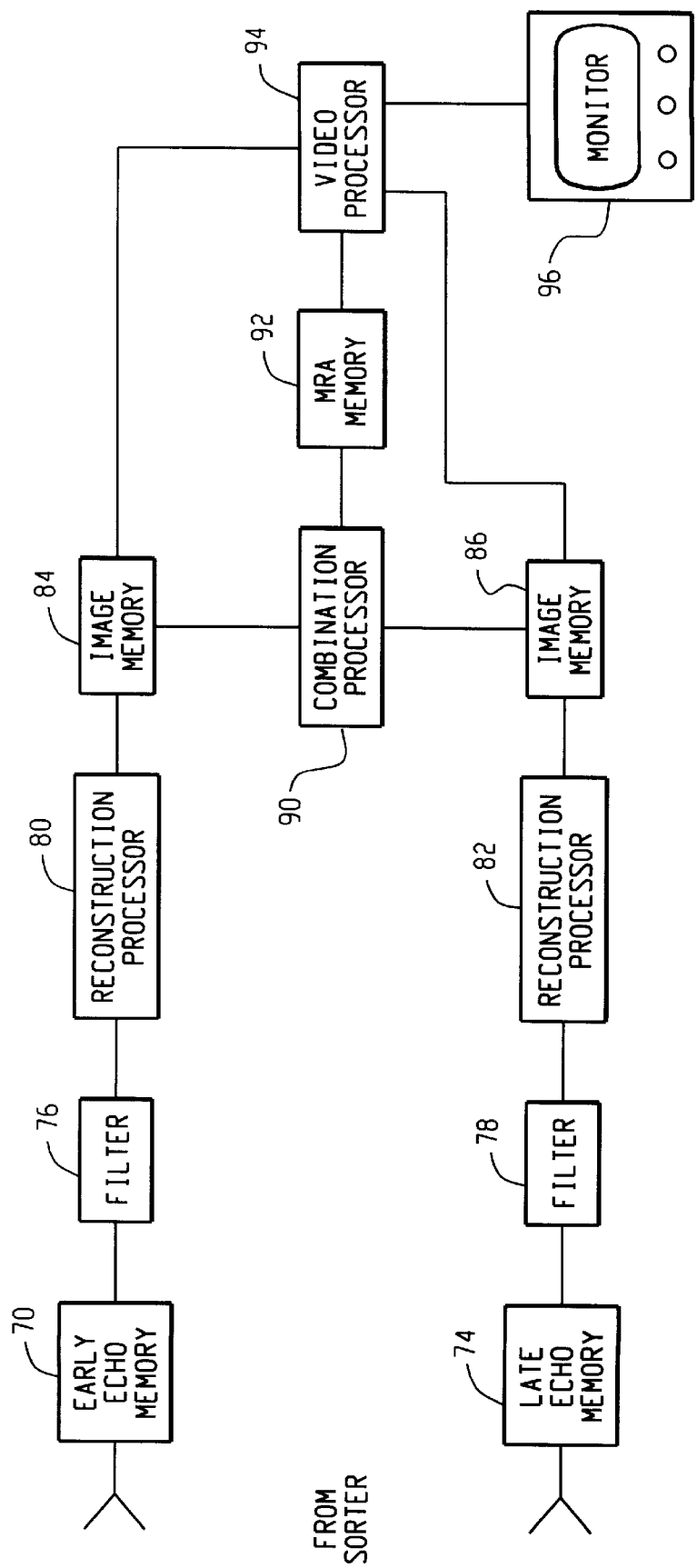

With reference to FIGS. 1A and 1B, a magnetic resonance imaging system 10 includes a main magnetic field control 12 which controls superconducting or resistive magnets 14 such that a substantially uniform, temporally constant main magnetic field is created along a z-axis through an examination region 16. Although a bore-type magnet is illustrated in FIG. 1, it is to be appreciated that the present invention is equally applicable to open magnet systems. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region 16. A digital radio frequency transmitter 24 transmits radio frequency pulses or pulse packets to a whole-body quadrature RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local quadrature radio frequency coil 34 is used to excite magnetic resonance and receive magnetic resonance signals emanating from the patient's head. Alternatively, a receive-only local radio frequency coil can be used for reception of resonance signals introduced by body-coil RF transmissions. An RF screen 36 screens the RF signals from the RF head coil from inducing any currents in the gradient coils and the surrounding structures. The resultant radio frequency signals, whether picked up in quadrature by the whole body RF coil 26, the local RF coil 34, or other specialized RF coils, are demodulated by a receiver 38, preferably a digital receiver.

A sequence control processor 40 controls the gradient pulse amplifiers 20 and the transmitter 24 to generate any of a plurality of magnetic resonance imaging and spectroscopy sequences, such as fast spin echo imaging, and other conventional sequences. For the selected sequence, the receiver 38 receives a plurality of data lines from a rapid succession of echoes following each RF excitation pulse. An analog-to-digital converter 42 converts each of the data lines to a digital format. The analog-to-digital converter 42 is disposed between the radio frequency receiving coil and the receiver 38 for digital receivers and is disposed down stream (as illustrated) from the receiver for analog receivers.

Figure 2:
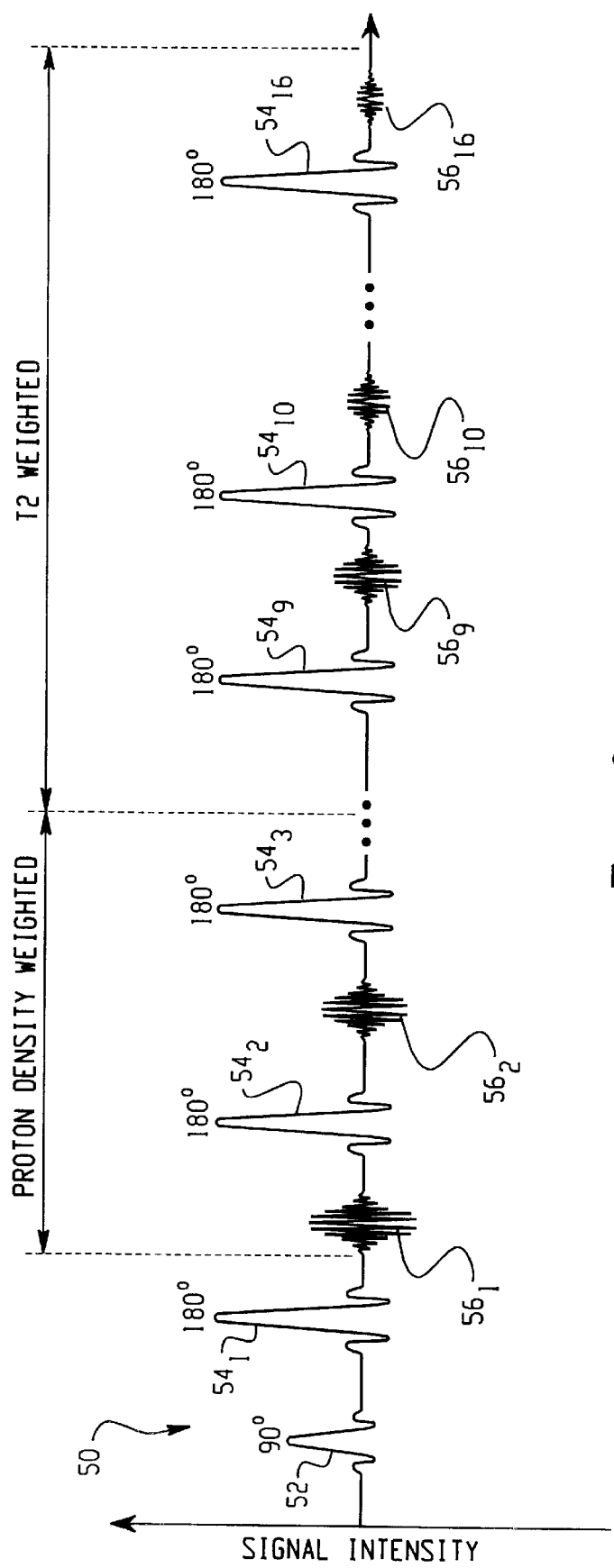
FIG. 2 illustrates one repeat of a preferred fast spin echo imaging sequence.

With reference to FIG. 2 and continuing reference to FIGS. 1A and 1B, a fast spin echo (FSE) imaging sequence 50 commences with a radio frequency excitation pulse 52, typically 90°. Following the RF excitation pulse, a series of 180° refocusing pulses are applied $54_1, 54_2, \ldots, 54_{16}$. The application of each refocusing pulse results in the generation of a magnetic resonance echo $56_1, 56_2, \ldots, 56_{16}$. While not shown in FIG. 2, it is to be appreciated that slice-select gradient pulses, phase-encoding gradient pulses, read gradient pulses, and the like are also applied as is typical in a fast spin echo sequence.

In a preferred embodiment, the FSE has an echo train length (ETL) of sixteen which generates sixteen echoes following each of sixteen 180° refocusing pulses. In the embodiment of FIG. 2, the first half of the ETL, preferably eight echoes, is reconstructed into a proton density weighted image (PDW), while the second half of the ETL, starting with the ninth echo, is reconstructed into a T2 weighted image.

Referring again to FIGS. 1A and 1B, the digital data lines are sorted by a sorter 60 between early echo data lines and late echo data lines. It will be appreciated that the first echo is the most heavily proton-density weighted or T1 weighted, while the last echo is the most heavily T2 weighted. The sorted radio frequency signals are stored into an early echo memory 70 and a late echo memory 74. Optionally, echoes near the mid-point of the sequence can be channeled to both memories. The MR data lines are preferably passed through filters 76, 78, such as a Blackman, Hanning, Hamming, or Gaussian filter. A pair of reconstruction processors 80, 82 (or a single time shared processor) reconstructs the data to form an electronic image representation. Reconstruction is preferably accomplished by a two-dimensional Fourier transform or other appropriate reconstruction algorithm. The image may represent a three-dimensional slab, a planar slice through the patient, an array of parallel planar slices, other three-dimensional volumes, or the like. The image representations are stored in image memories 84, 86.

At this point in the process, both a proton density weighted (PDW) image and a T2 weighted (T2W) volume image representation are stored in the image memories 84, 86. Proton density weighted images typically provide better background and tissue depiction; while T2 weighted images typically provide better vessel depiction for a black blood technique.

These two image representations are combined in image space by a combination processor 90. The PDW image and T2W image can be combined using a variety of methods, such as thresholding, addition, and multiplication of the images. In one preferred embodiment, the black blood portions of the T2 images are combined with the tissue image portions of the PDW images. More particularly, the T2W images are thresholded to identify voxels that are sufficiently black/dark gray that they indicate blood. Voxels blacker than the threshold are taken from the T2W image representation and voxels whiter than the threshold are taken from the PDW image representation. The combination of the PDW image and T2W image result in the generation of a black blood angiograph which is stored in an MRA memory 92.

A video processor 94 under operator control selects data from any or all of the PDW image memory 84, the T2W image memory 86 and the MRA image memory 94. In one preferred mode, the video processor selects corresponding slices from all three image memories for concurrent, side-by-side display on a monitor 96 to provide a human-readable display.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method for generating a black blood magnetic resonance angiograph of a body portion, said method comprising:
   (a) exciting dipoles within a selected imaging region to produce magnetic resonance signals;
   (b) inducing a train of magnetic resonance echoes after the excitation, early echoes of the train being more heavily proton density weighted and later echoes being more heavily T2 weighted;
   (c) spatially encoding the train of magnetic resonance echoes;
   (d) receiving and demodulating the train of magnetic resonance echoes into a series of data lines;
   (e) sorting the data lines between data lines from more heavily proton density weighted echoes and data lines from more heavily T2 weighted echoes;
   (f) reconstructing the more heavily proton density weighted data lines into a proton density weighted image representation and the more heavily T2 weighted data lines into a T2 weighted image representation;
   (g) combining the proton density weighted image representation and the T2 weighted image representation to generate a black blood angiographic image representation;
   (h) selecting corresponding portions of the proton density weighted image representation, the T2 weighted image representation, and the angiographic image representation; and,
   (i) converting the selected image representation portions into a concurrent, side-by-side human-readable display of the selected portions.

2. The method as set forth in claim 1 wherein the step of inducing a train of magnetic resonance echoes includes:
   applying an inversion pulse to invert magnetic resonance in the excited dipoles into a first echo;
   applying an additional inversion pulse after the first echo to induce a second echo; and,
   applying additional inversion pulses following the second and subsequent echoes to induce additional echoes.

3. A method for generating a black blood magnetic resonance angiograph of a body portion, said method comprising:
   (a) applying a fast spin echo sequence to generate a train of N magnetic resonance echoes, where N is an integer, early echoes of the train being more heavily proton density weighted and later echoes being more heavily T2 weighted;
   (b) encoding the train of magnetic resonance echoes;
   (c) receiving and demodulating the train of magnetic resonance echoes into a series of data lines;
   (d) sorting the data lines by proton density weighting echoes and T2 weighting echoes;
   (e) reconstructing more heavily proton density weighted data lines into a proton density weighted image representation and more heavily T2 weighted data lines into a T2 weighted image representation; and,
   (f) combining the proton density weighted image representation and the T2 weighted image representation to generate a black blood angiographic image representation.

4. The method as set forth in claim 3 further including:
   converting the angiographic image representation into a human-readable display.

5. The method as set forth in claim 3 wherein N is an even integer, the sorting step further including:
   sorting a first N/2 of the data lines for reconstruction of the proton weighted image; and,
   sorting a second N/2 of the data lines for reconstruction of the T2 weighted image.

6. A method of magnetic resonance imaging comprising:
   applying a plurality of fast spin echo imaging sequences to generate a plurality of trains of magnetic resonance echoes, within each train, early echoes nearer the beginning of each train being more heavily proton density weighted and echoes toward the end of each train being more heavily T2 weighted;
   receiving and demodulating each echo into a corresponding data line;
   sorting the data lines by proton density weighting and T2 weighting;
   reconstructing the data lines from the more heavily proton density weighted echoes into a proton density weighted image representation and reconstructing the data lines from the more heavily T2 weighted echoes into a T2 weighted image representation;
   multiplying the proton density weighted image representation and the T2 weighted image representation to generate a black blood angiographic image representation; and,
   selecting and converting corresponding portions of at least two of the proton density weighted image representation and the T2 weighted image representation and the black blood angiographic image representation into a human-readable, side-by-side display of the corresponding portions.

7. A magnetic resonance imaging system which includes a magnet for generating a temporally constant magnetic field through an examination region, a radio frequency transmitter for exciting and inverting magnetic dipoles in the examination region to generate a train of N magnetic resonance echoes, where N is an integer, and gradient magnetic field coils and a gradient magnetic field controller for generating at least phase and read magnetic field gradient pulses in orthogonal directions across the examination region, a receiver for receiving and demodulating the magnetic resonance echoes to produce a series of data lines, the system further comprising:
   a sort processor for sorting data lines between proton density weighted data lines and T2 weighted data lines;
   an early echo volume memory for storing the proton density weighted data lines;
   a late echo volume memory for storing the T2 weighted data lines;
   an image processor for reconstructing the proton density weighted data lines into a proton density weighted image representation and the T2 weighted data lines into a T2 weighted image representation;

a combination processor for combining the proton density weighted and the T2 weighted image representations to generate a black blood angiographic image representation;

a selection processor for selecting portions of the proton density weighted image representation, the T2 weighted image representation, and the black blood angiographic image representation; and, a video processor and monitor for converting the selected image representation portions into a concurrent, side-by-side human-readable display.

8. The magnetic resonance imaging system according to claim 7, wherein the system includes:

a filter which emphasizes the dark areas of the T2 weighted image representation.

9. The magnetic resonance imaging system according to claim 7, wherein the image processor includes at least one of a one-dimensional, two-dimensional, and three-dimensional Fourier transform processor for reconstructing the proton density weighted data lines into a proton density weighted image representation and the T2 weighted data lines into a T2 weighted image representation.

10. A method of angiographic imaging, the method comprising:

without presaturation, applying an RF excitation pulse;

applying a series of RF inversion pulses to induce a corresponding series of spin echoes;

spatially encoding the spin echoes;

converting each spin echo into a data line;

reconstructing early echo data lines into an image which strongly depicts tissue and weakly depicts blood vessels;

reconstructing late echo data lines into an image which depicts tissue weakly and depicts blood vessels strongly in dark tones;

thresholding the late echo image to remove light tones and isolate a dark blood vessel image; and overlaying the dark blood vessel image and the early echo image to create a combined image that strongly depicts both dark blood vessels and surrounding tissue.

* * * * *